(12) United States Patent
Yamashita

(10) Patent No.: US 9,613,994 B2
(45) Date of Patent: Apr. 4, 2017

(54) CAPACITANCE DEVICE IN A STACKED SCHEME AND METHODS OF FORMING THE SAME

(71) Applicant: Taiwan Semiconductor Manufacturing Company, Ltd., Hsin-Chu (TW)

(72) Inventor: Yuichiro Yamashita, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 253 days.

(21) Appl. No.: 14/333,307

(22) Filed: Jul. 16, 2014

(65) Prior Publication Data

US 2016/0020235 A1    Jan. 21, 2016

(51) Int. Cl.
*H01L 27/146* (2006.01)

(52) U.S. Cl.
CPC .... *H01L 27/14609* (2013.01); *H01L 27/1469* (2013.01); *H01L 27/14612* (2013.01); *H01L 27/14634* (2013.01); *H01L 27/14636* (2013.01); *H01L 27/14641* (2013.01); *H01L 27/14689* (2013.01)

(58) Field of Classification Search
CPC ......... H01L 27/14609; H01L 27/14612; H01L 27/14634; H01L 27/14636; H01L 27/14689; H01L 27/1469; H01L 27/14643
USPC ............................... 250/208.1; 257/290–292
See application file for complete search history.

(56) References Cited

U.S. PATENT DOCUMENTS

2011/0316119 A1* 12/2011 Kim ..................... H01G 2/065
257/532
2012/0133381 A1*  5/2012 Bruland ................. H01L 22/32
324/754.03

* cited by examiner

*Primary Examiner* — Seung C Sohn
(74) *Attorney, Agent, or Firm* — Slater Matsil, LLP

(57) ABSTRACT

Embodiments of the present disclosure include devices and sensor packages and methods of forming the same. An embodiment is a device including a first semiconductor chip. The first semiconductor chip includes a first substrate, a first conductive pad over the first substrate. The device further includes a second semiconductor chip having a second surface bonded to a first surface of the first semiconductor chip. The second semiconductor chip includes a second substrate and a second conductive pad over the second substrate. The second conductive pad and the first conductive pad form a first capacitor.

20 Claims, 15 Drawing Sheets

CAPACITANCE DEVICE IN A STACKED SCHEME AND METHODS OF FORMING THE SAME

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked semiconductor devices, e.g., 3D integrated circuits (3DIC), have emerged as an effective alternative to further reduce the physical size of a semiconductor device. In a stacked semiconductor device, active circuits such as logic, memory, processor circuits, and the like are fabricated on different semiconductor wafers. Two or more semiconductor wafers may be installed on top of one another to further reduce the form factor of the semiconductor device.

Two semiconductor wafers may be bonded together through suitable bonding techniques. The commonly used bonding techniques include direct bonding, chemically activated bonding, plasma activated bonding, anodic bonding, eutectic bonding, glass frit bonding, adhesive bonding, thermo-compressive bonding, reactive bonding and/or the like. An electrical connection may be provided between the stacked semiconductor wafers. The stacked semiconductor devices may provide a higher density with smaller form factors and allow for increased performance and lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
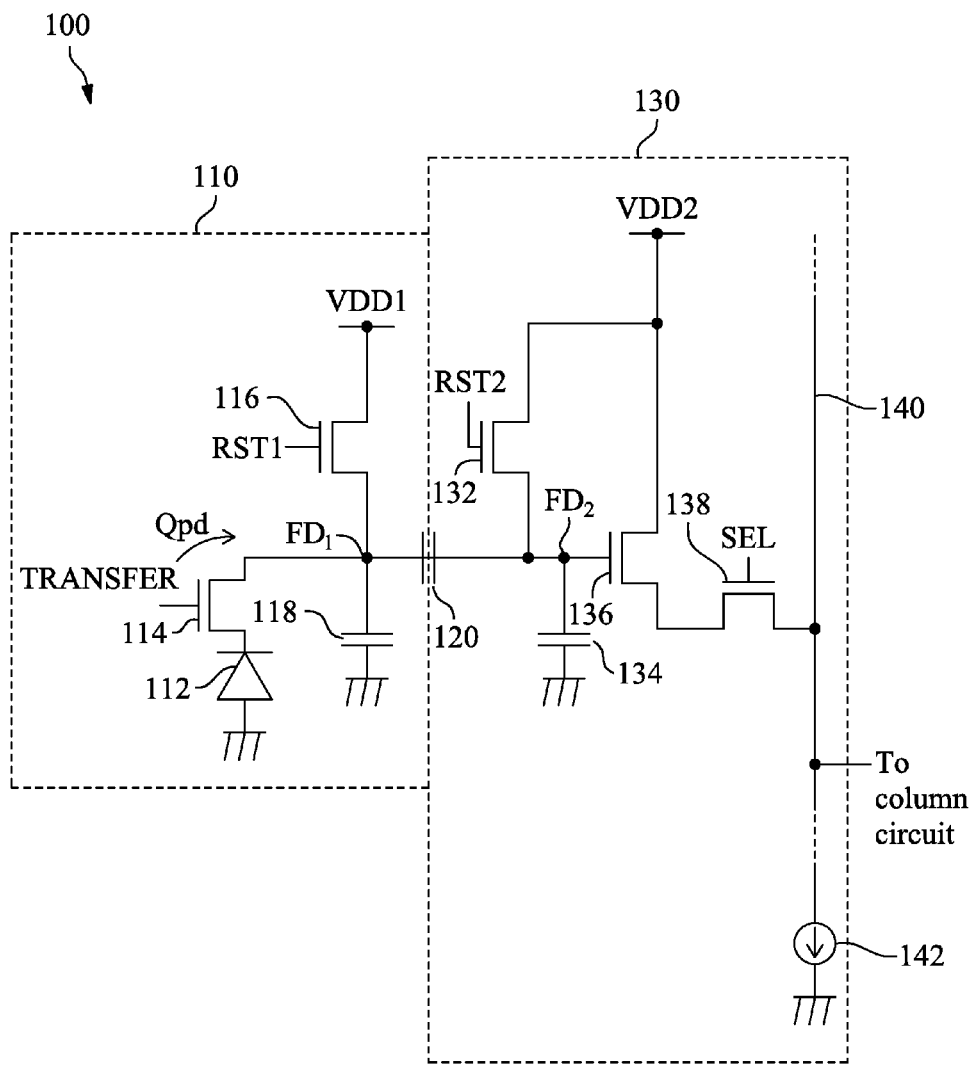
FIG. 1 illustrates a schematic circuit diagram of a pixel unit in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a schematic circuit diagram of a pixel unit 100 in accordance with some embodiments. The pixel unit 100 includes a photodiode 112, a transfer gate transistor 114, a reset transistor 116, a floating diffusion capacitor 118, a bridge capacitor 120, a reset transistor 132, a floating diffusion capacitor 134, a source follower 136, a row selector 138, an output line 140, and a current source 142. In this embodiment, the transistors in the portion 130 in the second chip are illustrated as NMOS transistors; although they may also be PMOS transistors (see FIG. 7).

The pixel unit 100 includes portion 110 in a first chip and portion 130 in a second chip. In some embodiments, the photodiode 112 has an anode coupled to an electrical ground, and a cathode coupled to a source of the transfer gate transistor 114, which has a gate coupled to a transfer line. The transfer line of the pixel unit 100 may be connected to timing generator circuits to receive the control signals. The drain of the transfer gate transistor 114 may be coupled to a floating diffusion node $FD_1$. The floating diffusion node $FD_1$ is coupled to the drain of the reset transistor 116 and a first electrode of the bridge capacitor 120. The reset transistor 116 has a gate coupled to a reset line RST1, which may be connected to the timing generator circuits to receive further control signals. A source of the reset transistor 116 may be coupled to a first chip power supply voltage VDD1. The floating diffusion capacitor 118 may be coupled between the source/drain of the transfer gate transistor 114 and the first electrode of the bridge capacitor 120. The reset transistor 116 is used to preset the voltage at floating diffusion node $FD_1$ to VDD1. The bridge capacitor 120 capacitively couples the portion 110 of the pixel unit 100 to the portion 130 of the pixel unit 100.

The second electrode of the bridge capacitor 120 may be coupled to a floating diffusion node $FD_2$. The floating diffusion node $FD_2$ is coupled to the drain of the reset transistor 132 and a gate of the source follower 136. The reset transistor 132 has a gate coupled to a reset line RST2, which may be connected to the timing generator circuit block to receive further control signals. A source of the reset transistor 132 may be coupled to a second chip power supply voltage VDD2. The floating diffusion capacitor 134 may be coupled between the second electrode of the bridge capacitor 120 and the gate of the source follower 136. The reset transistor 132 is used to preset the voltage at floating diffusion node $FD_2$ to VDD2. A drain of the source follower 136 is coupled to the second chip power supply voltage VDD2. A source of the source follower 136 is coupled to the row selector 238. The source follower 136 provides a low impedance output for the pixel unit 100. The row selector 138 functions as the select transistor of the respective pixel unit 100, and the gate of the row selector 138 is coupled to select line SEL, which may be electrically coupled to the timing generator circuit block. A drain of the row selector 138 is coupled to an output line 140 which includes the current source 142 and may be coupled to the column circuit of the image sensor to process the signal generated in the photodiode 112.

The bridge capacitor 120 allows for each of the respective chips to have different power supply voltages VDD1 and VDD2. For example, VDD1 can be a higher voltage such as 5V or 3.3 V, and VDD2 can be a lower voltage such as 2 V or 1.2 V. In this example, the photodiode 24 is still provided a high voltage VDD1 so that it may provide better performance, but the reset transistor 132, the source follower 136, and the row selector 138 operate a lower voltage VDD2. Hence, the overall power consumption of the pixel unit 100 is reduced which provides many benefits such as, reduced size of devices, reduced heat generation, etc.

In the operation of pixel unit 100, when light is received by the photodiode 112, the photodiode 112 generates electrical charges Qpd, wherein the amount of the charges Qpd is related to the intensity or the brightness of the incident light. The electrical charges Qpd are transferred by enabling the transfer gate transistor 114 through a transfer signal applied to the gate of the transfer gate transistor 114. The electrical charges may be stored in the floating diffusion capacitor 118 at the floating diffusion node $FD_1$, which may be then capacitively coupled by the bridge capacitor 120 to the floating diffusion capacitor 134 at the floating diffusion capacitor node $FD_2$. The bridge capacitor 120 prevents a direct current (DC) signal from propagating from the photodiode 112 to the source follower 136, but an alternating current (AC) signal will pass through the bridge capacitor 120. This AC signal of the Qpd can be used, for example, by a correlated double sampling (CDS) circuit coupled to the output line 140 to measure the level of the electrical charges Qpd.

When used in image sensors, CDS is a noise reduction technique in which a reference voltage of the pixel unit 100 (e.g., the pixel's voltage after it is reset, which includes the kTC noise, i.e.

$$Q_n = \frac{\sqrt{kTC}}{q})$$

is removed from the signal voltage of the pixel (e.g., the pixel's voltage at the end of sampling) at the end of each sampling period.

In some embodiments, the voltage at the floating diffusion node $FD_1$ may be represented by the equation:

$$dV_{FD1} = \frac{Qpd}{C_{118} + \frac{C_{120}}{C_{134}}} \quad [Eq. 1]$$

Wherein Qpd is the electrical charges from the photodiode 112, $C_{118}$ is the capacitance of the floating diffusion capacitor 118, $C_{120}$ is the capacitance of the bridge capacitor 120, and $C_{134}$ is the capacitance of the floating diffusion capacitor 134. Equation 1 can be simplified to:

$$dV_{FD1} = \frac{Qpd}{C_{118} + kC_{134}} \quad [Eqn. 2]$$

Wherein k is:

$$k = \frac{1}{1 + \frac{C_{134}}{C_{120}}} \quad [Eq. 3]$$

Using the k variable, the voltage at the floating diffusion node $FD_2$ may be represented by the equation:

$$dV_{FD2} = \frac{kQpd}{C_{118} + kC_{134}} \quad [Eq. 4]$$

The electrical charges at the floating diffusion node $FD_2$ enable the source follower 136, thereby allowing the electrical charges Qpd generated by the photodiode 112 to pass through the source follower 136 to the row selector 126. When sampling is desired, the select line SEL is enabled, allowing the electrical charges to flow through row selector 126 to data processing circuits, for example, column circuit block, or image signal processing circuits, which are coupled to the output of the row selector 126.

It should be noted that although FIG. 1 illustrates a schematic diagram of an exemplary pixel unit 100 in a BSI image sensor chip, the pixel units 100, which are separated to into to two chips, may also be used in other types of image sensor chips such as front side illumination image sensor chips. It should further be noted that while FIG. 1 illustrates a pixel unit 100 in a five-transistor (5T) structure, a person skilled in art will recognize that the 5T diagram is merely an example, which should not unduly limit the scope of the embodiments. One skilled in the art would recognize many variations, alternatives, and modifications. For example, various embodiments may include but not limited to a three-transistor pixel, a four-transistor pixel, a six-transistor pixel, and the like.

Figure 2:
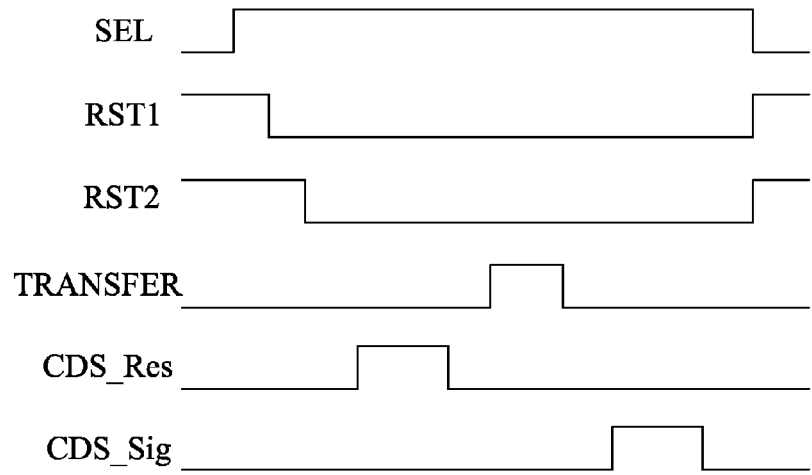
FIG. 2 illustrates a timing diagram of the operation of the pixel unit of FIG. 1 in accordance with some embodiments.

FIG. 2 illustrates a timing diagram of the operation of the pixel unit of FIG. 1 in accordance with some embodiments. In this embodiment, the pixel unit 100 is read by a CDS circuit with a CDS reset line (CDS_Res) and a CDS signal line (CDS_Sig). The CDS reset line enables the CDS circuitry to read the pixel unit 100 output voltage after reset (reference voltage) and the CDS signal line enables the CDS circuitry to read the pixel unit 100 output voltage at the end of the sampling period (signal voltage). The CDS circuitry will then subtract the reset voltage from the signal voltage to obtain an output voltage which is substantially free of the kTC noise of the floating diffusions.

At the beginning of the timing diagram, the select line SEL is brought high to allow the electrical charges from the pixel unit 100 to flow through the row selector 126 to the data processing circuits. After the floating diffusion capacitors 118 and 134 are charged, the reset signals RST1 and RST2 are brought low to allow the voltages of floating diffusion nodes $FD_1$ and $FD_2$ to be set by the floating diffusion capacitors 118 and 134. The CDS reset line (CDS_Res) is then toggled to enable the CDS circuitry to read the reference voltage of the pixel unit 100 output. Next, the transfer line is toggled to enable the transfer gate transistor 114 to transfer the electrical charges Qpd of the photodiode 112 to the $FD_1$ node and the bridge capacitor 120. The AC signal component of the electrical charges Qpd is then coupled to the source follower 136 and through the row selector 138. The CDS signal line (CDS_Sig) is then toggled to enable the CDS circuitry to read the signal voltage of the pixel unit 100 output. After the signal voltage is read, the reset lines RST1 and RST2 are brought high and the select line SEL is brought low so that the process in FIG. 2 may be repeated.

Figure 3:
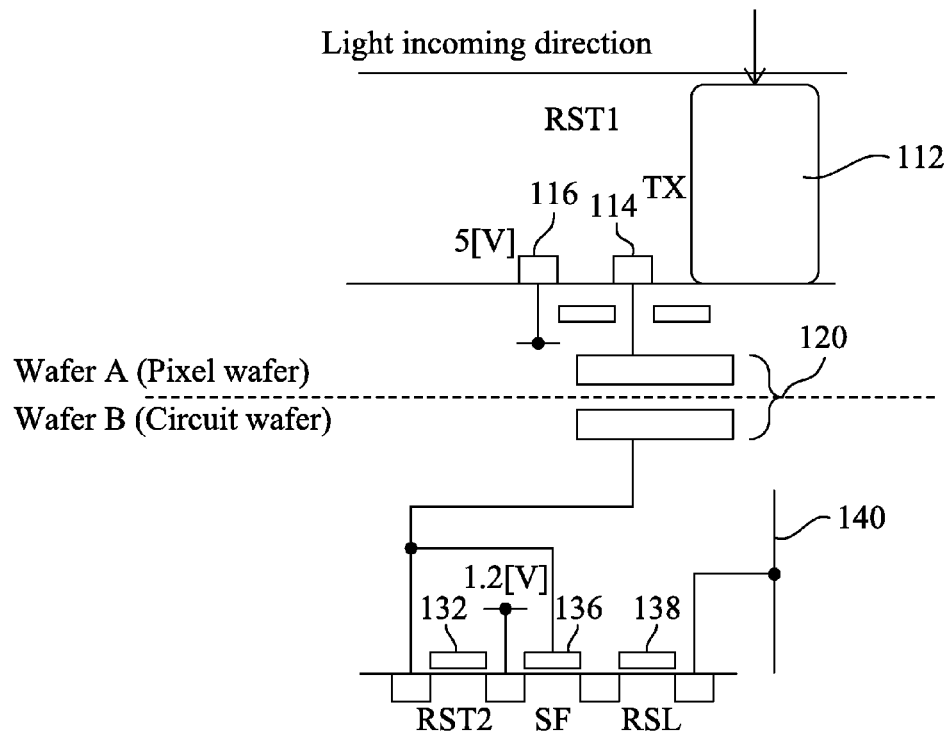
FIG. 3 illustrates a simplified cross-sectional view of a pixel unit in a stacked image sensor in accordance with some embodiments.

FIG. 3 illustrates a simplified cross-sectional view of a pixel unit in a stacked image sensor in accordance with some embodiments. In this embodiment, the pixel unit 100 is separated into two chips/dies/wafers, the pixel wafer and the circuit wafer. The pixel wafer includes the photodiode 112, the transfer gate transistor 114, the reset transistor 116, and a first electrode of the bridge capacitor 120. The circuit wafer includes a second electrode of the bridge capacitor 120, the reset transistor 132, the source follower 136, the row selector 138, and the output line 140. In the illustrated embodiment, the pixel wafer has a VDD1 of about 5 V and the circuit wafer has a VDD2 of about 1.2 V. In some embodiments, the bridge capacitor 120 is formed by conductive pads at the bonding interface of the pixel wafer and the circuit wafer. By forming the bridge capacitor 120 at the bonding interface between the two wafers, the effect of parasitic capacitance of the conductive pads is as small as theoretically possible because the conductive pads of the bridge capacitor 120 are as far from the surfaces of the wafers as possible.

Figure 4A:
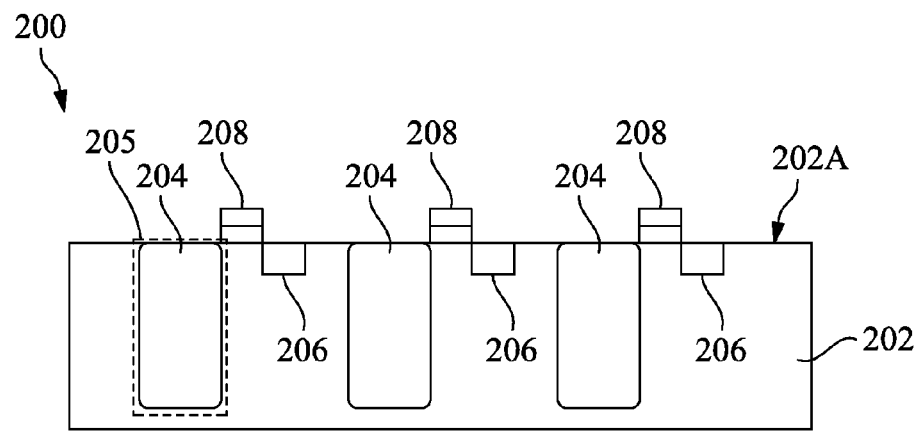
FIGS. 4A-4H illustrate cross-sectional views of intermediate stages in the manufacturing of a stacked image sensor in accordance with some embodiments.

FIGS. 4A-4H illustrate cross-sectional views of intermediate stages in the manufacturing of a stacked image sensor in accordance with some embodiments. FIG. 4A is a cross-sectional view illustrating the formation of photosensitive regions 204, floating diffusion drain regions 206, and transfer gates 208 on and over a substrate 202 in a sensor die 200.

The substrate 202 may include, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

The photosensitive regions 204, each corresponding to individual image sensor pixels, are formed near the front side 202A of the substrate 202. In some embodiments, the photosensitive region 204 is part of a pinned photodiode, a PN junction diode, a p-type-intrinsic semiconductor-n-type junction (PIN junction) diode, a bipolar phototransistor, or the like. A photodiode 205 includes, in some embodiments, a photosensitive region 204 and a surface layer (not shown) acting as the cathode and anode of a pinned diode.

The floating diffusion drain regions 206 are formed near the front side 202A of the substrate 202, separated from the photodiode 205 to form a source/drain pair for a transistor. Additionally, isolation regions (not shown) such as shallow trench isolation regions (STIs) can be disposed in the substrate 202. The STIs may be disposed between each pair of photodiode 205-floating diffusion drain regions 206 to isolate operation of each pixel.

It should be understood that the figures describing the process described herein depict a portion of a die with a limited number of photosensitive regions 204. However, the region of the die and number of photosensitive regions 204 shown is limited to more clearly depict the process and techniques described herein and should not be construed as limiting. One of ordinary skill in the art will recognize that the substrate 202 can be of any size or configuration, and will have any number of photodiodes 205, photosensitive regions 204, active devices, or other structures disposed thereon without departing from the spirit of the embodiments.

The transfer gates 208 span the floating diffusion drain region 206 and photodiode 205. The photodiode 205 acts as a source for a transistor and the floating diffusion drain region 206 acts as the drain in a transistor controlled by the transfer gate 208. The photosensitive region 204 generates electrons in response to light impinging on the photosensitive region 204. The photodiode 205 and the floating diffusion drain region 206 form a transistor with the transfer gate 208 controlling the flow of current from the photodiode 205 to the floating diffusion drain region 206 to indicate sensed light.

Figure 4B:
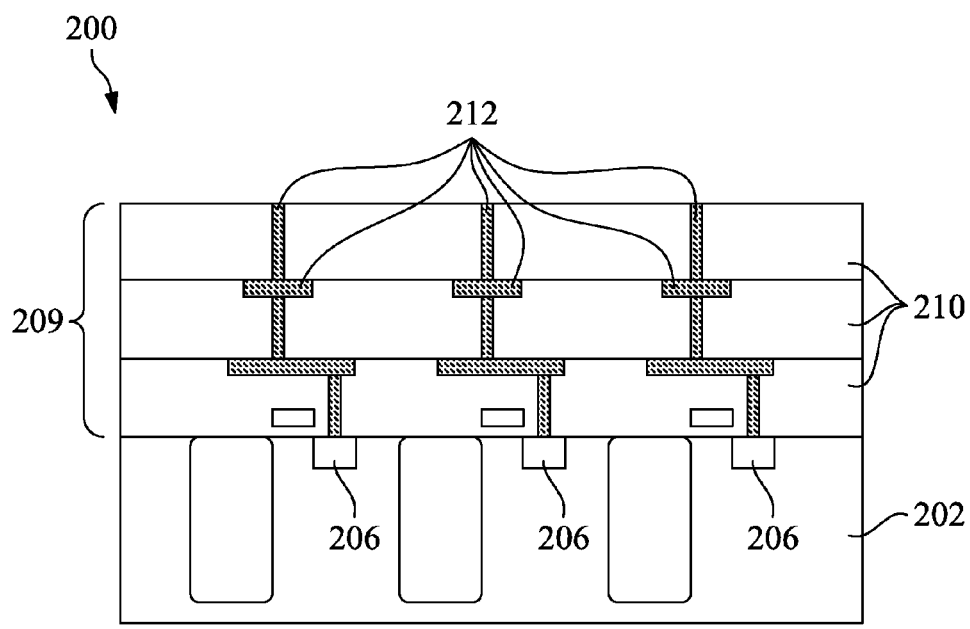

FIG. 4B illustrates the formation of interconnect structure 209 in accordance with some embodiments. The interconnect structure 209 is formed on the front side 202A of the substrate 202. The interconnect structure 209 includes one or more dielectric layers 210 with conductive elements 212 such as metal lines and vias disposed in a dielectric material. The conductive elements 212 connect to portions of the floating diffusion drain 206 and the transfer gate 208 to provide electrical connectivity, for example, between two or more diffusion drains 206 and/or the transfer gates 208, or between the diffusion drains 206 and the transfer gates 208 and an application specific integrated circuit (ASIC) die, an external connection pad such as a mounting pad, or another device.

The dielectric layers 210 may be formed, for example, of a low-K dielectric material, such as phosphosilicate glass (PSG), borophosphosilicate glass (BPSG), FSG, $SiO_xC_y$, SiO, SiON, SiN, Spin-On-Glass, Spin-On-Polymers, silicon carbon material, compounds thereof, composites thereof, combinations thereof, or the like, by any suitable method known in the art, such as spinning, chemical vapor deposition (CVD), and plasma-enhanced CVD (PECVD). It should also be noted that each of the dielectric layers 210 may comprise a plurality of dielectric layers.

The conductive elements 212 may include a diffusion barrier layer including one or more layers of TaN, Ta, TiN, Ti, CoW, the like, or a combination thereof, and a conductive material including copper, tungsten, aluminum, silver, the like, or combinations thereof. The conductive elements 212 may be formed by electro-plating, physical vapor deposition, sputtering, the like, or a combination thereof.

It should also be noted that one or more etch stop layers (not shown) may be positioned between adjacent ones of the dielectric layers. Generally, the etch stop layers provide a mechanism to stop an etching process when forming vias and/or contacts. The etch stop layers are formed of a dielectric material having a different etch selectivity from adjacent layers, e.g., the underlying substrate 202 and the overlying dielectric layers 210. In an embodiment, etch stop layers may be formed of SiN, SiCN, SiCO, CN, combinations thereof, or the like, deposited by CVD or PECVD techniques.

In some embodiments, the interconnect structure 209 is formed by depositing a dielectric layer 210, and forming conductive elements 212 in the dielectric layer 210 before forming an overlying dielectric layer 210. The process is repeated to provide the connection between, for example, the diffusion drains 206 and the transfer gates 208, the control transistors, the output ports such as mounting pads, or other target features. In some embodiments, the lowest dielectric layer is an interlayer dielectric (ILD) with vias extending there though to connect underlying structure such as transistor gates or source/drains to overlying structures. In such embodiments, dielectric layers 210 overlying the ILD each have an intermetal dielectric (IMD) portion and an overlying metallization layer. The IMD portion includes vias extending vertically through the IMD, and the metallization layer comprises conductive lines extending laterally through a dielectric portion of the metallization layer. The conductive lines connect the vias in the underlying IMD with other vias in the same or overlying IMD layers.

The vias and lines are formed in the dielectric layers 210, in some embodiments, using, for example, a damascene technique (see FIGS. 5A-5C), such as a dual damascene technique. The dual damascene technique comprises two masking/etching steps, the first masking and etching step includes masking and etching the routes for the conductive lines followed by masking and etching the via openings. A metal layer is subsequently formed in the etched openings. In this manner, multiple dielectric layers 210 provide multiple IMD layers and multiple metal layers to provide electrical connectivity routed throughout the die.

Figure 4C:
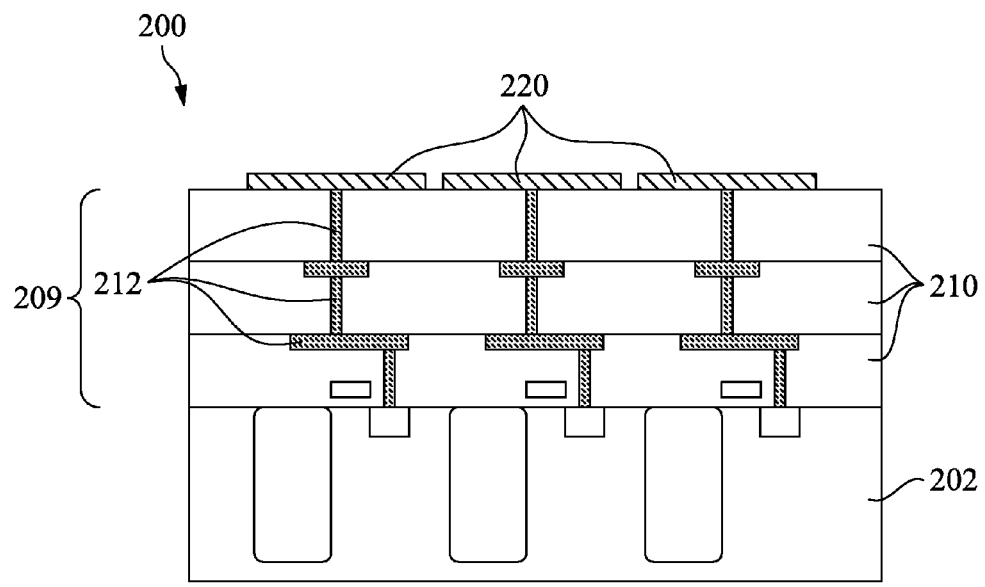

FIG. 4C illustrates the formation of conductive pads 220 over one of the interconnect structure 209 of the sensor die 200. The conductive pads 220 are coupled to the conductive elements 212 in the interconnect structure 209. In some embodiments, each of the conductive pads 220 is coupled to at least one of the conductive elements 212. The conductive pads 220 will form one of the electrodes of the bridge capacitors 402 (see FIG. 4G) and may be referred to as capacitor electrodes 220.

The capacitor electrodes 220 may include a diffusion barrier layer including one or more layers of TaN, Ta, TiN, Ti, CoW, the like, or a combination thereof, and a conductive material including copper, tungsten, aluminum, silver, the like, or combinations thereof. The capacitor electrodes 220 may be formed by electro-plating, physical vapor deposition, sputtering, the like, or a combination thereof.

Figure 4D:
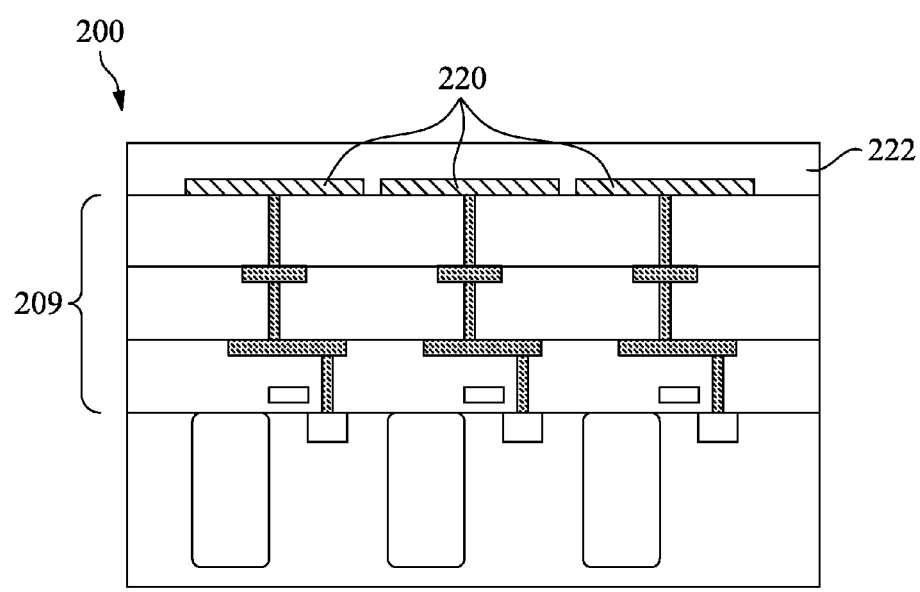

FIG. 4D illustrates forming an interface dielectric layer 222 over the capacitor electrodes 220 and the interconnect structure 209. The interface dielectric layer 222 will be interposed between the conductive electrode pairs forming at least a part of the insulating layer of the bridge capacitors 402. Another interface dielectric layer (see 314 in FIG. 4F) may also be between the conductive electrode pairs forming another part of the insulating layer of the bridge capacitors 402.

The interface dielectric layer 222 may be formed, for example, of a low-K dielectric material, such as phosphosilicate glass (PSG), borophosphosilicate glass (BPSG), FSG, $SiO_xC_y$, SiO, SiON, SiN, Spin-On-Glass, Spin-On-Polymers, silicon carbon material, compounds thereof, composites thereof, combinations thereof, or the like, by any suitable method known in the art, such as spinning, CVD, and PECVD. It should also be noted that the interface dielectric layer 222 may comprise a plurality of dielectric layers. In some embodiments, the interface dielectric layer 222 is formed of a same material as the dielectric layers 210.

Figure 4E:
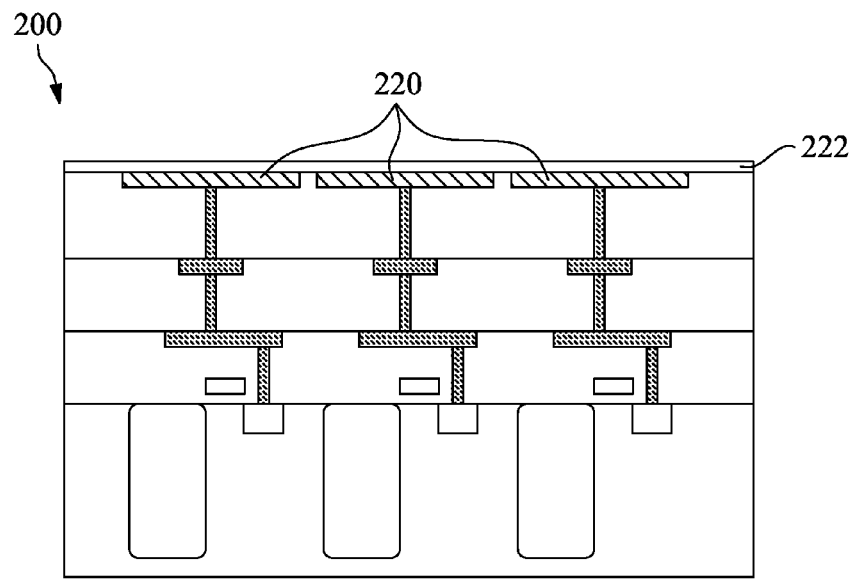

FIG. 4E illustrates an optional thinning process to thin the interface dielectric layer 222. In some embodiments, the interface dielectric layer 222 is initially formed to have a thickness that is too thick for the subsequently formed bridge capacitor 402 to function properly. In these embodiments, the interface dielectric 222 may be thinned to a more suitable thickness by an etching process, a chemical mechanical polish (CMP) process, the like, or a combination thereof. In other embodiments, the thinning process is omitted as the initial thickness of the interface dielectric 222 is suitable for the formation of the bridge capacitors 402.

Figure 4F:
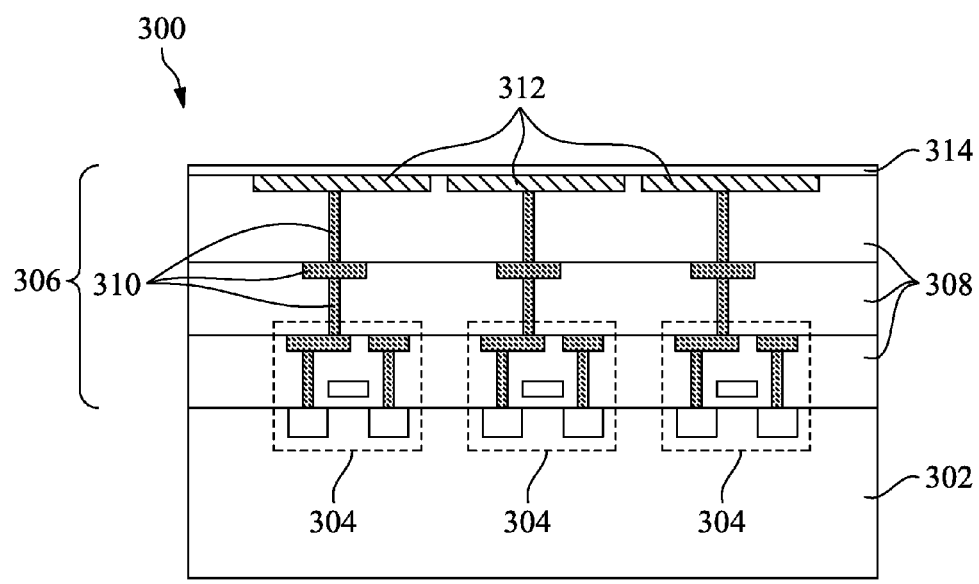

FIG. 4F illustrates a circuit die 300 at an intermediate stage of processing. In an embodiment, the sensor die 200 is a backside illumination sensor (BSI) and the circuit die 300 is a logic circuit, such as an ASIC device. The circuit die 300 includes a substrate 302, one or more transistors 304 disposed on the substrate and an interconnect structure 306 over the substrate 302 and the transistors 304. The circuit die 300 may include a logic circuit, an analog-to-digital converter, a data processing circuit, a memory circuit, a bias circuit, a reference circuit, the like, or a combination thereof. In some embodiments, the transistors 304 may be reset transistors (see 132 in FIG. 1), source followers (see 136 in FIG. 1), and/or row selectors (see 138 in FIG. 1).

In some embodiments, the circuit die 300 includes for example, analog circuits, the image signal processing circuits, which may include analog-to-digital converters (ADCs), correlated double sampling (CDS) circuits, row decoders, the like, or a combination thereof.

The substrate 302 may include, for example, bulk silicon, doped or undoped, or an active layer of a SOI substrate. Generally, an SOI substrate comprises a layer of a semiconductor material, such as silicon, formed on an insulator layer. The insulator layer may be, for example, a BOX layer or a silicon oxide layer. The insulator layer is provided on a substrate, typically a silicon or glass substrate. Other substrates, such as a multi-layered or gradient substrate may also be used.

The interconnect structure 306 includes dielectric layers 308 and conductive elements 310 formed therein. The interconnect structure 306, the dielectric layers 308, and the conductive elements 310 may be similar to the interconnect structure 209, the dielectric layers 210, and conductive elements 212 described above and the description is not repeated herein.

FIG. 4F also illustrates conductive pads 312 over the interconnect structure 306 and an interface dielectric layer 314 over the conductive pads 312 and the interconnect structure 306. The conductive pads 312 are coupled to the conductive elements 310 in the interconnect structure 306. The conductive pads 312 will form one of the electrodes of the bridge capacitors 402 (see FIG. 4G) and may be referred to as capacitor electrodes 312. The capacitor electrodes 312 may be similar to the capacitor electrodes 220 described above and the description is not repeated herein.

The interface dielectric layer 314 will be interposed between the conductive electrode pairs (220 and 314) forming at least a part of the insulating layer of the bridge capacitors 402. Another interface dielectric layer (see 222 in FIG. 4E) may also be between the conductive electrode pairs forming another part of the insulating layer of the bridge capacitors 402. The interface dielectric layer 314 may be similar to the interface dielectric layer 222 described above and the description is not repeated herein.

Figure 4G:
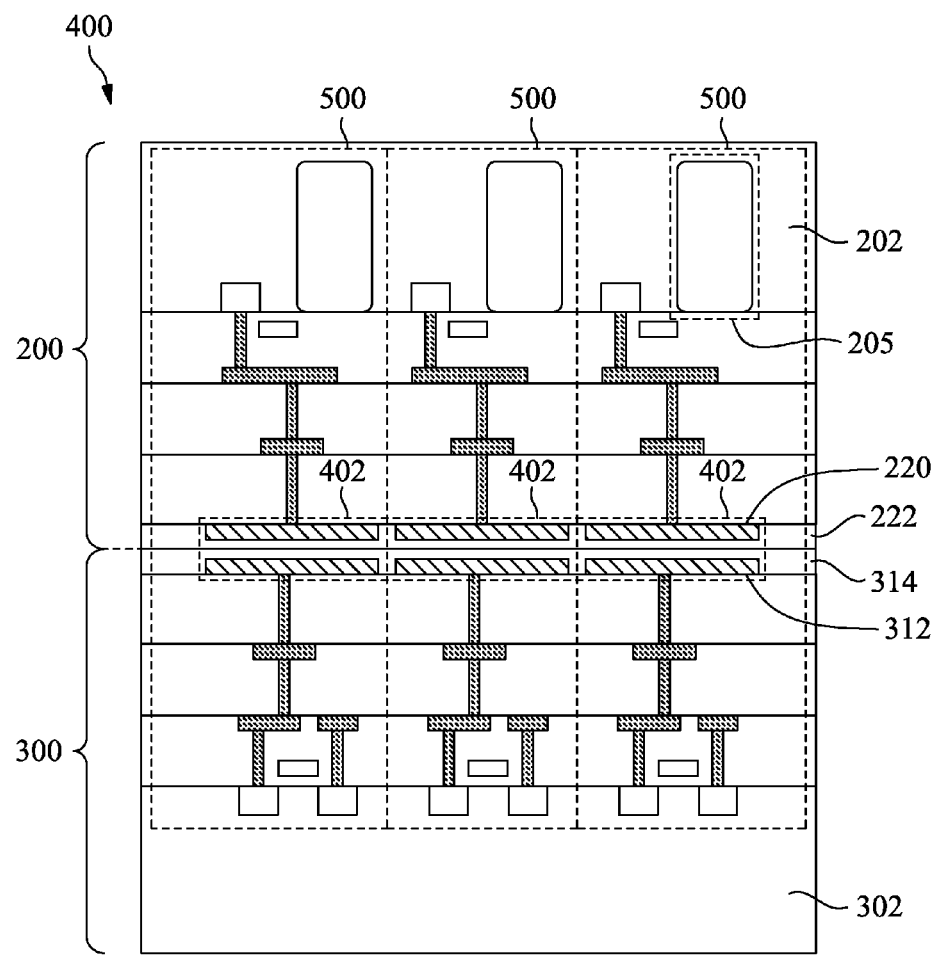

FIG. 4G illustrates the sensor die 200 and the circuit die 300 after bonding to form sensor package 400 in accordance with an embodiment. The sensor die 200 will be stacked and bonded on top of the circuit die 300. The sensor die 200 and the circuit die 300 may be bonded using, for example, a direct bonding process such as dielectric-to-dielectric bonding (e.g., oxide-to-oxide bonding), metal-to-dielectric bonding (e.g., oxide-to-copper bonding), any combinations thereof and/or the like.

It should be noted that the bonding may be at wafer level, wherein the sensor die 200 and the circuit die 300 are bonded together, and are then singulated into separated dies. Alternatively, the bonding may be performed at the die-to-die level, or the die-to-wafer level.

After the sensor die 200 and the circuit die 300 are bonded, a thinning process may be applied to the backside of the sensor die 200. In an embodiment in which the substrate 202 is a BSI sensor, the thinning process serves to allow more light to pass through from the backside of the substrate 202 to the photodiodes 205 without being absorbed by the substrate 202. In an embodiment in which the BSI sensor is fabricated in an epitaxial layer, the backside of the sensor die 200 may be thinned until the epitaxial layer is exposed. The thinning process may be implemented by using suitable techniques such as grinding, polishing, a SMARTCUT® procedure, an ELTRAN® procedure, and/or chemical etching.

In the BSI sensor embodiment, the bonding of the dies forms the pixel units 500 with the bridge capacitors 402 being a part of the pixel units 500. Each of the bridge capacitors includes a capacitor electrode 220 and an interface dielectric layer 222 of the sensor die, and a capacitor electrode 312 and an interface dielectric layer 314 of the circuit die 300. In some embodiments, the pixel units 500 have each of the components of the pixel units 100 of FIG. 1, with the bridge capacitor 402 being equivalent to the bridge capacitor 120.

In other embodiments, the sensor die 200 and the circuit die 300 are not image sensor dies and the bridge capacitor 402 may be used as a capacitor in a different type of circuit, such as an amplifier circuit, an analog-to-digital converter (ADC), or the like.

Figure 4H:
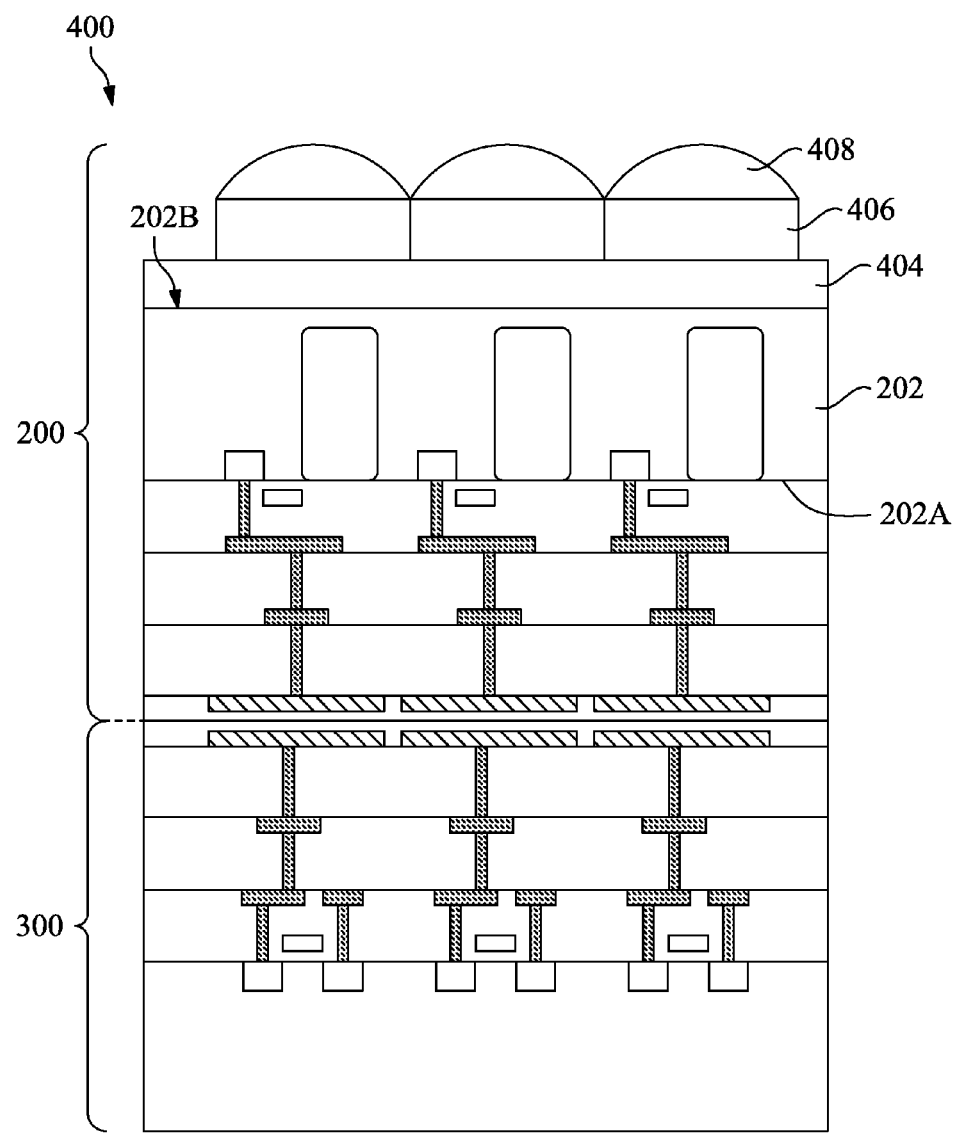

FIG. 4H illustrates, in the BSI sensor embodiment, the formation of an upper layer 404, color filters 406, and micro-lenses 408 on the back side 202B of the substrate 202 of the sensor die 200. The upper layer 404 (sometimes referred to as a buffer layer) may include one or more upper layers, and may include one or more of a bottom anti-reflective coating (BARC), a silicon oxide layer, and a silicon nitride layer.

Figure 5A:
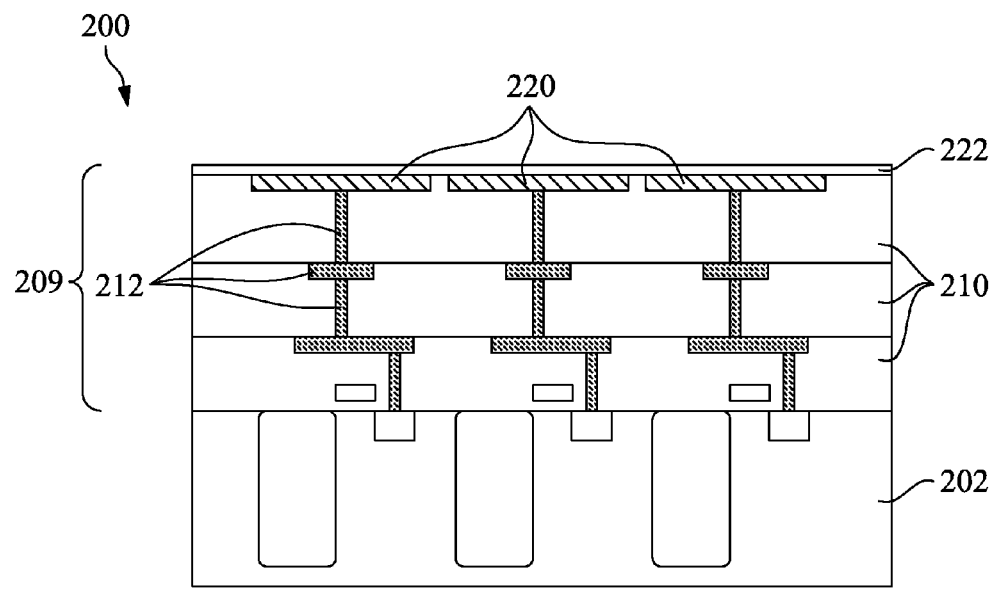
FIGS. 5A-5C illustrate cross-sectional views of intermediate stages in the manufacturing of a stacked image sensor in accordance with some embodiments.
Figure 5B:
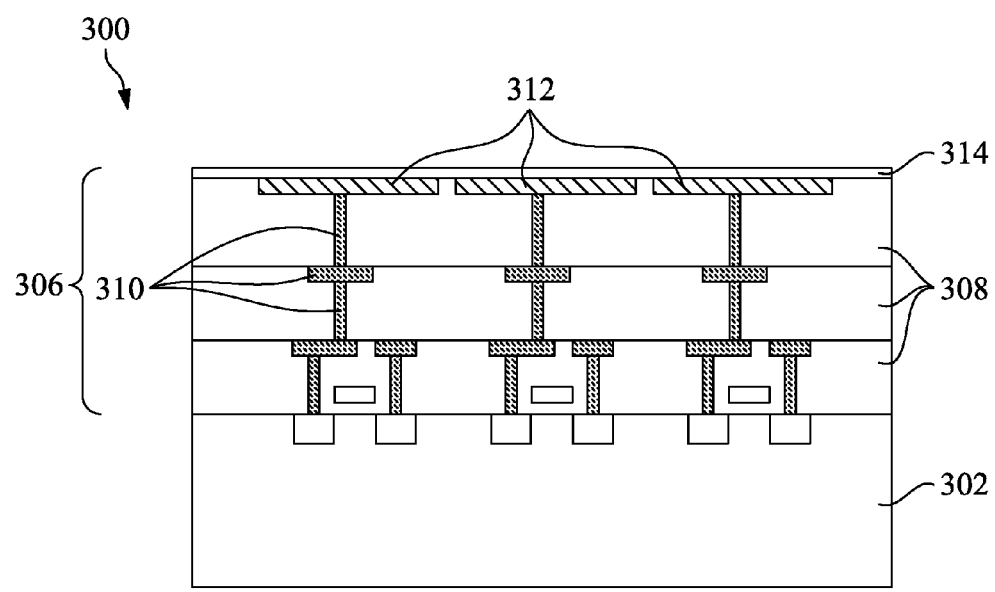
Figure 5C:
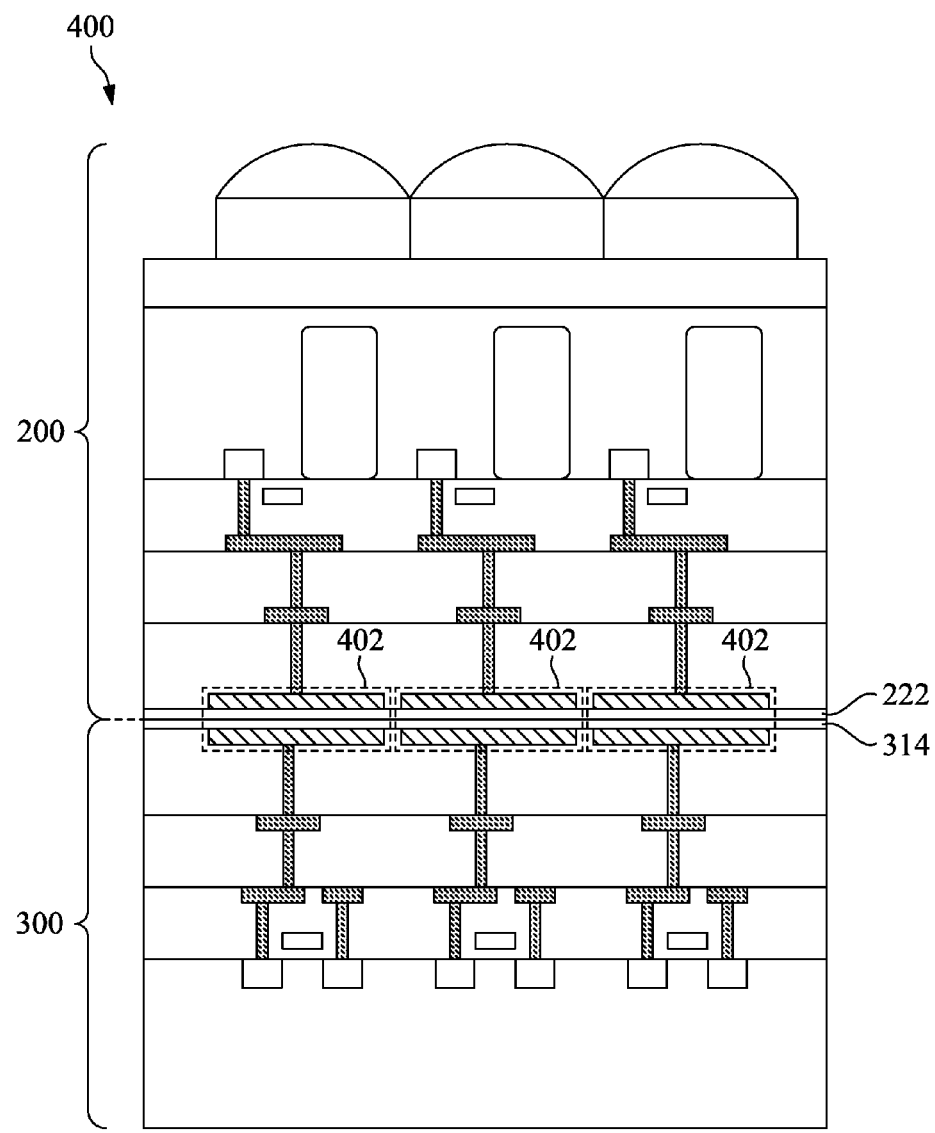

FIGS. 5A-5C illustrate cross-sectional views of intermediate stages in the manufacturing of a stacked image sensor in accordance with some embodiments. This embodiment is similar to the embodiment of FIGS. 4A-4H except that the capacitor electrodes 220 and 312 are formed by a damascene technique in one of the dielectric layers 210 and 308, respectively of the interconnect structures 209 and 306. Details of this embodiment which are similar to the previous embodiment are not repeated herein.

As illustrated in FIGS. 5A and 5B, the capacitor electrodes 220 and 312 are formed in the dielectric layers 210 and 308, respectively. The interface dielectric layers 222 and 314 are formed as thin dielectric layers over the conductive electrodes without any need for a thinning step. This may be advantageous as it can be difficult to control the thickness of a dielectric layer remaining after a thinning step, such as a CMP process.

FIG. 5C illustrates the sensor package 400 after bonding the sensor die 200 and the circuit die 300 and the formation of the back side of the sensor package. The sensor package 400 in FIG. 5C is similar to the sensor package 400 in FIG. 4H described above and the description is not repeated herein.

Figure 6A:
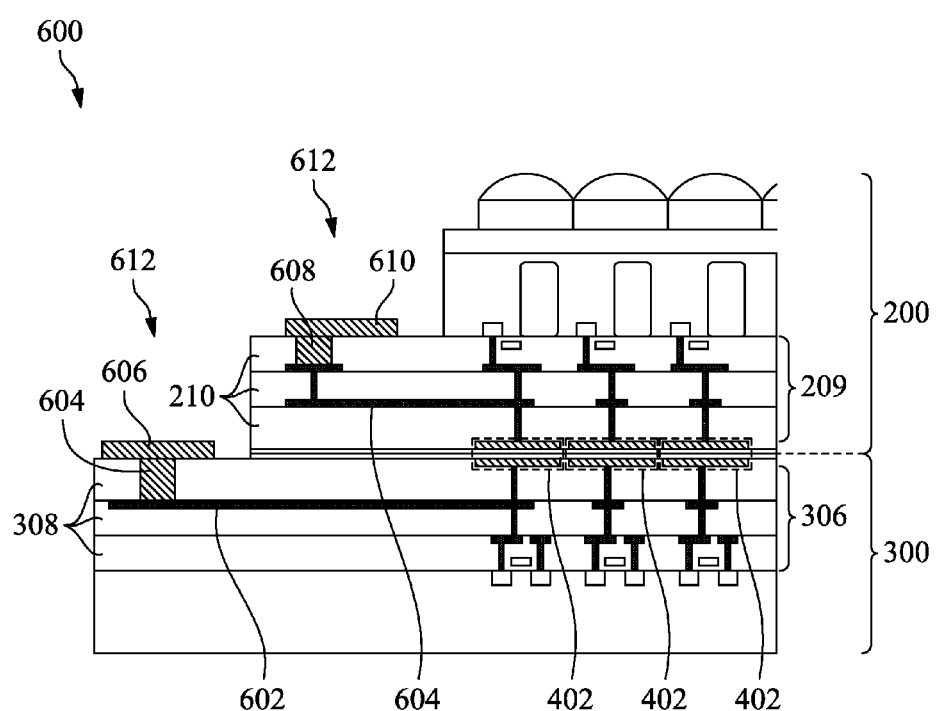
FIGS. 6A-6C illustrate cross-sectional views of pad configurations of a stacked image sensor in accordance with some embodiments.
Figure 6B:
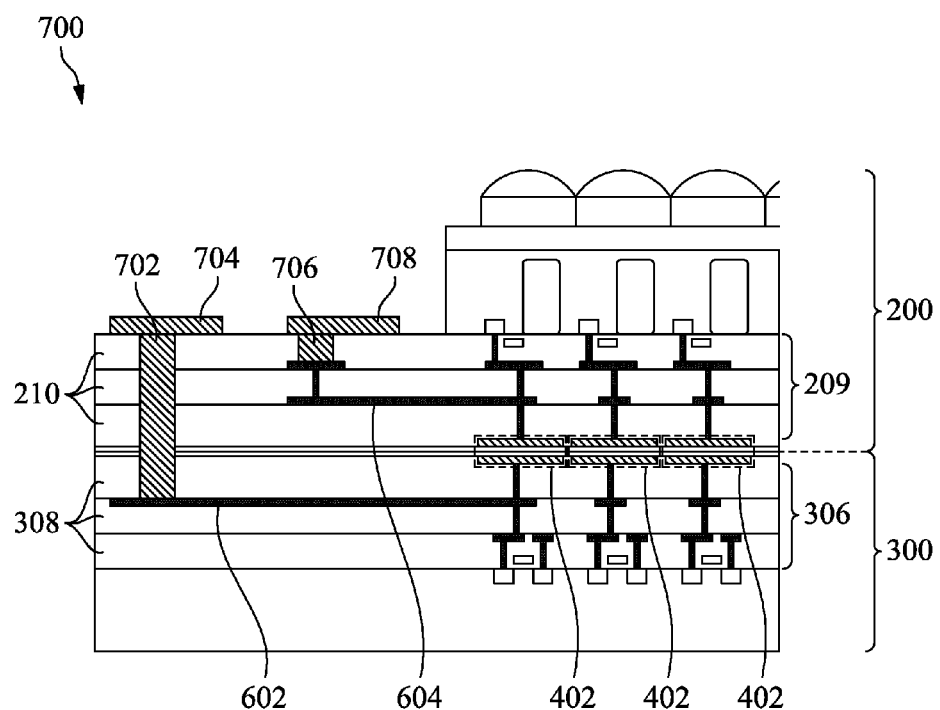
Figure 6C:
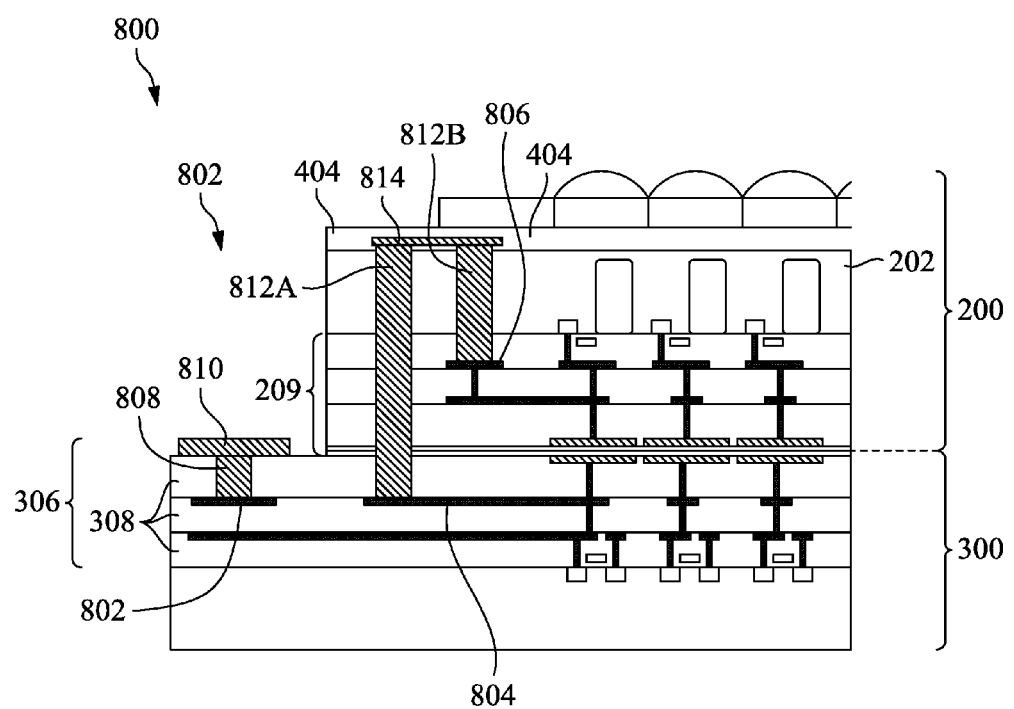

FIGS. 6A-6C illustrate cross-sectional views of pad configurations of a stacked image sensor in accordance with some embodiments. FIG. 6A illustrates a sensor package 600 including a sensor die 200 and a circuit die 300. The sensor package 600 is similar to the sensor package 400 described above except that the sensor package 600 illustrates bonding pads at the edge of the sensor package 600. Details of this embodiment which are similar to the previous embodiments are not repeated herein.

In this embodiment, pad openings 612 have been formed to expose portions of the interconnect structures 209 and 306. A via 604 has been formed through a portion of the interconnect structure 306 and is coupled to a conductive element (land) 602 in the interconnect structure 306. A via 608 has been formed through a portion of the interconnect structure 209 and is coupled to a conductive element 604 of the interconnect structure 209. Bonding pads 606 and 610 have been formed over and coupled to the vias 604 and 608, respectively. In some embodiments, the bonding pads 606 and 610 are disposed in a scribe line between or bordering active portions of dies on a wafer. The bonding pads 606 and 610 allow for DC signals to be coupled to the circuit die 300 and the sensor die 200, respectively, as the bonding pads 606 and 610 bypass the bridge capacitors 402. In this embodiment, the bonding pads 606 and 610 are formed at different levels.

The bonding pads 606 and 610 and the vias 604 and 608 may include a diffusion barrier layer including one or more layers of TaN, Ta, TiN, Ti, CoW, the like, or a combination thereof, and a conductive material including copper, tungsten, aluminum, silver, the like, or combinations thereof. The bonding pads 606 and 610 and the vias 604 and 608 may be formed by electro-plating, physical vapor deposition, sputtering, the like, or a combination thereof.

FIG. 6B illustrates a cross-sectional view of a sensor package 700 with bonding pads 704 and 708 coupled to the circuit die 300 and the sensor die 200, respectively. The sensor package 700 is similar to the sensor package 600 described above except that the sensor package 700 illustrates bonding pads that are formed at the same level. Details of this embodiment which are similar to the previous embodiments are not repeated herein.

A via 702 has been formed through the interconnect structure 209 and a portion of the interconnect structure 306 and is coupled to the conductive element 602 in the interconnect structure 306. A via 706 has been formed through a portion of the interconnect structure 209 and is coupled to the conductive element 604 of the interconnect structure 209. Bonding pads 704 and 708 been formed over and coupled to the vias 702 and 706, respectively. The bonding pads 704 and 708 allow for DC signals to be coupled to the circuit die 300 and the sensor die 200, respectively, as the bonding pads 704 and 708 bypass the bridge capacitors 402. In this embodiment, the bonding pads 704 and 708 are formed at a same level.

FIG. 6C illustrates a cross-sectional view of a sensor package 800 with a bonding pad 810 coupled to the circuit die 300 and an interconnect 814 coupling the sensor die 200 and the circuit die 300. The sensor package 800 is similar to the sensor package 600 described above except that the sensor package 800 illustrates an interconnect 814 coupling the sensor die 200 and the circuit die 300. Details of this embodiment which are similar to the previous embodiments are not repeated herein.

A via 808 has been formed through a portion of the interconnect structure 306 and is coupled to a conductive element 802 in the interconnect structure 306. A via 812A has been formed through the substrate 202, the interconnect structure 209, and a portion of the interconnect structure 306 and is coupled to a conductive element 804 of the interconnect structure 306. A via 812B has been formed through the substrate 202 and a portion of the interconnect structure 209 and is coupled to a conductive element 806 of the interconnect structure 209. The interconnect 804 is coupled to both of the vias 812A and 812B and is disposed within the upper layer 404. The vias 812A and 812B and the interconnect 814 couple at least portion of the interconnect structure 209 and the interconnect structure 306 together. A bonding pad 810 has been formed over and coupled to the via 808. The bonding pad 810 allows for DC signals to be coupled to the circuit die 300 and the sensor die 200 as the bonding pad 810 and the interconnect 814 bypasses the bridge capacitors 402.

Figure 7:
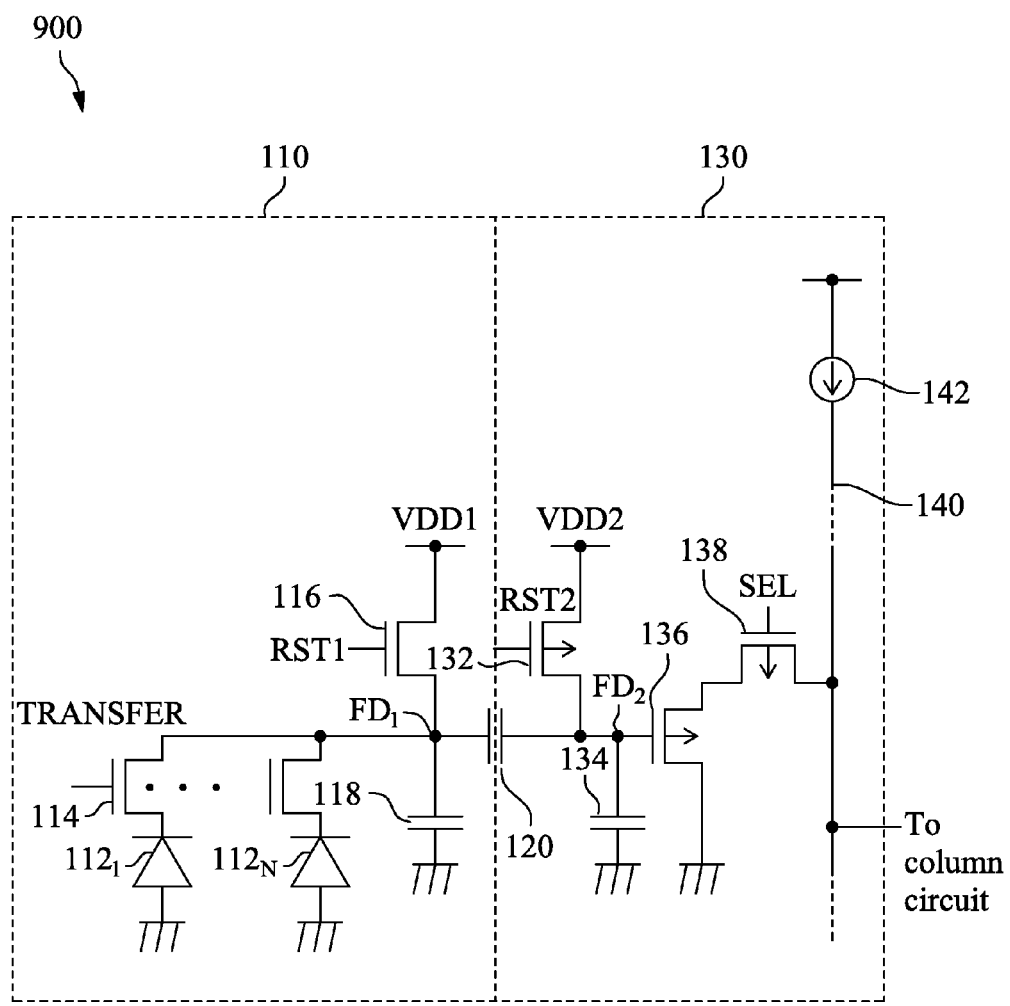
FIG. 7 illustrates a schematic circuit diagram of a pixel unit in accordance with some embodiments.

FIG. 7 illustrates a schematic circuit diagram of a pixel unit 900 in accordance with some embodiments. The pixel unit 900 is similar to the pixel unit 100 in FIG. 1 except that the pixel unit 900 has PMOS transistors in the portion 130 of the second chip and the pixel unit 900 illustrates multiple photodiodes $112_1$ through $112_N$ in the pixel unit 900. Details of this embodiment which are similar to the previous embodiments are not repeated herein.

Figure 8:
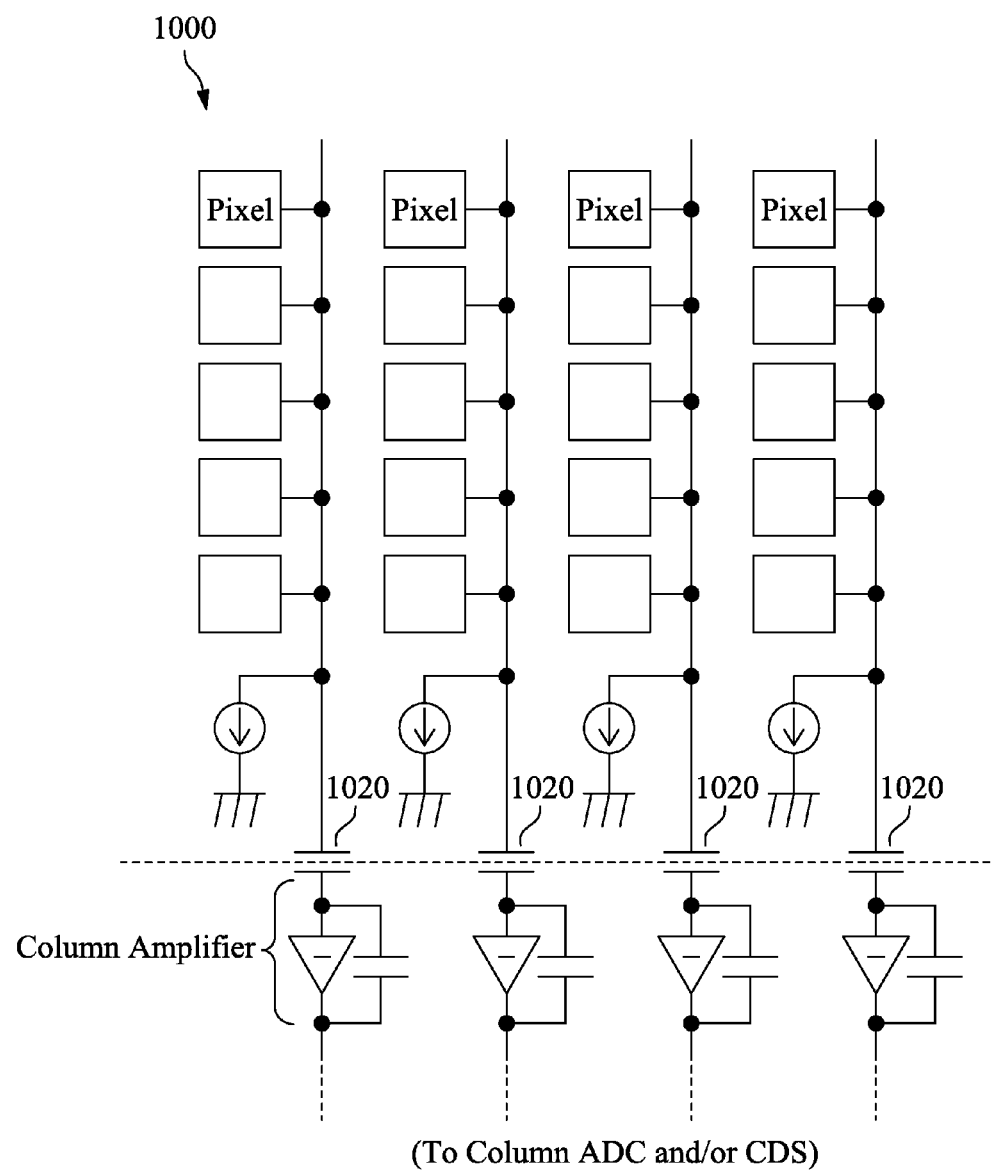
FIG. 8 illustrates a schematic circuit diagram of column amplifiers for an array of pixels in accordance with some embodiments.

FIG. 8 illustrates a schematic circuit diagram of column amplifiers for an array of pixels 1000 in accordance with some embodiments. In this embodiment, the capacitors 1020 of column amplifiers for a pixel array 1000 are formed as bridge capacitors at the bonding interface between two chips/dies/wafers. The bridge capacitors 1020 may be similar to the bridge capacitors 120 and 402 described above and the description is not repeated herein.

Figure 9:
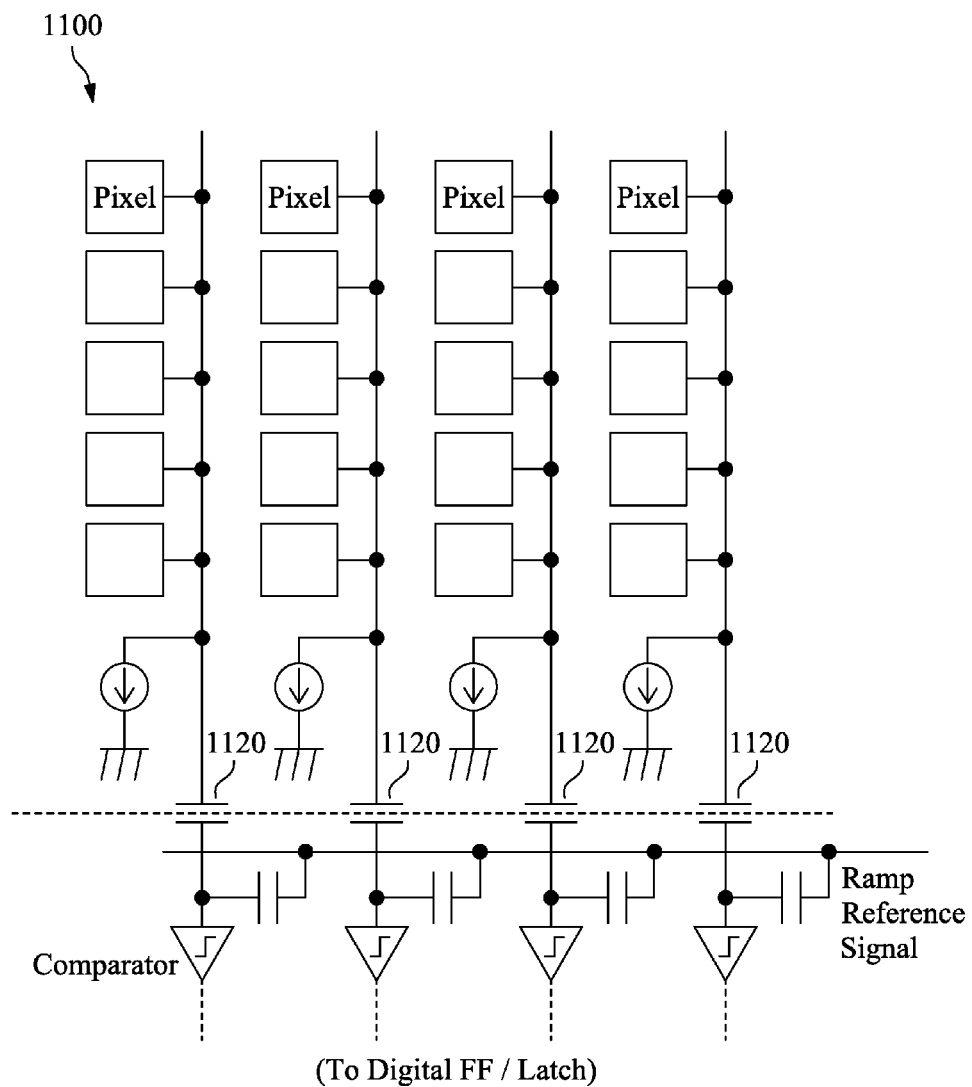
FIG. 9 illustrates a schematic circuit diagram of column analog-to-digital converters (ADCs) for an array of pixels in accordance with some embodiments.

FIG. 9 illustrates a schematic circuit diagram column ADCs for an array of pixels 1100 in accordance with some embodiments. In this embodiment, the capacitors 1120 of the column ADCs for a pixel array 1100 are formed as bridge capacitors at the bonding interface between two chips/dies/wafers. The bridge capacitors 1120 may be similar to the bridge capacitors 120 and 402 described above and the description is not repeated herein.

By forming a bridge capacitor at the bonding interface of the dies, the effect of parasitic capacitance of the bridge capacitor to the substrates of the dies is as small as theoretically possible because the bridge capacitor at the bonding interface is as far from the surfaces of the substrates as possible. In addition, the bridge capacitor allows for each of the respective dies to have different power supply voltages by decoupling the circuits of the dies from each other. For example, one of the dies can have a higher voltage to ensure better performance of that die while the other die operates at a lower voltage to save reduce the power consumption. Hence, the overall power consumption of the die package is reduced which provides many benefits such as, reduced size of devices, reduced heat generation, etc.

An embodiment is a device including a first semiconductor chip. The first semiconductor chip includes a first substrate, a first conductive pad over the first substrate. The device further includes a second semiconductor chip having a second surface bonded to a first surface of the first semiconductor chip. The second semiconductor chip includes a second substrate and a second conductive pad over the second substrate. The second conductive pad and the first conductive pad form a first capacitor.

Another embodiment is a device including a sensor chip and a circuit chip. The sensor chip includes a plurality of pixels disposed in a first side of a first substrate and a first plurality of conductive pads over the first side of the first substrate. Each of the first plurality of conductive pads being coupled to one of the plurality of pixels. The circuit chip is underlying and bonded to the sensor chip. The circuit chip includes a plurality of active devices disposed in a second substrate and a second plurality of conductive pads over the second substrate. Each of the second plurality of conductive pads being coupled to at least one of plurality of active devices, and each of the second plurality of conductive pads being paired with one of the first plurality of conductive pads forming a plurality of capacitors.

A further embodiment a method including forming a first semiconductor chip. The forming the first semiconductor chip includes forming a first conductive pad over a first substrate. The method further includes forming a second semiconductor chip including forming a second conductive pad over a second substrate. The method further includes bonding a first surface of the first semiconductor chip to a second surface of the second semiconductor chip, and forming a first capacitor with the first conductive pad and the second conductive pad being electrodes of the first capacitor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    a first semiconductor chip comprising:
        a first substrate; and
        a first conductive pad over the first substrate; and
    a second semiconductor chip having a second surface bonded to a first surface of the first semiconductor chip, the first surface physically contacting the second surface, the second semiconductor chip comprising:
        a second substrate; and
        a second conductive pad over the second substrate, the second conductive pad and the first conductive pad forming a first capacitor.

2. The device of claim 1, wherein the first capacitor is a bridge capacitor between the first semiconductor chip and the second semiconductor chip.

3. The device of claim 1, wherein the first semiconductor chip is a sensor chip comprising a photodiode therein, and wherein the second semiconductor chip is an application specific integrated circuit (ASIC) chip comprising a logic device therein.

4. The device of claim 3, wherein the logic device comprises a first reset transistor, a source follower, and a row selector.

5. The device of claim 3, wherein the ASIC chip further comprises an image signal processing circuit, the image signal processing circuit comprising a circuit selected from the group consisting essentially of an analog-to-digital converter (ADC), a correlated double sampling (CDS) circuit, a row decoder, and combinations thereof.

6. The device of claim 3, wherein the photodiode and the logic device are coupled to each other through the first capacitor forming a pixel unit.

7. The device of claim 6, wherein the sensor chip further comprises a transfer gate transistor coupled to the photodiode and a second reset transistor coupled to the transfer gate transistor and the first capacitor, the transfer gate transistor and the second reset transistor being a part of the pixel unit.

8. The device of claim 1, wherein the first semiconductor chip has a first power supply voltage, and wherein the second semiconductor chip has a second power supply voltage, the second power supply voltage being lower than the first power supply voltage.

9. The device of claim 1, wherein the first conductive pad and the second conductive pad of the first capacitor are separated by a dielectric layer, the dielectric layer being a bonding interface between the first semiconductor chip and the second semiconductor chip.

10. A device comprising:
a sensor chip comprising a plurality of pixels disposed in a first side of a first substrate and a first plurality of conductive pads over the first side of the first substrate, each of the first plurality of conductive pads being coupled to one of the plurality of pixels; and
a circuit chip underlying and bonded to the sensor chip, the circuit chip comprising a plurality of active devices disposed in a second substrate and a second plurality of conductive pads over the second substrate, each of the second plurality of conductive pads being coupled to at least one of plurality of active devices, each of the second plurality of conductive pads being paired with one of the first plurality of conductive pads forming a plurality of capacitors.

11. The device of claim 10, wherein the sensor chip further comprises a plurality of transfer gates coupled to the plurality of pixels and a first plurality of reset transistors coupled to the plurality of transfer gates and the first plurality of conductive pads of the plurality of capacitors.

12. The device of claim 11, wherein the active devices of the circuit chip comprise a second plurality of reset transistors, a plurality of source followers, and a plurality of row selectors.

13. The device of claim 10, wherein the sensor chip has a first power supply voltage and the circuit chip has a second power supply voltage, the first power supply voltage being higher than the second power supply voltage.

14. The device of claim 10, wherein the sensor chip further comprises a first redistribution layer between the first side of the first substrate and the first plurality of conductive pads, the first redistribution layer comprising a plurality of dielectric layers with conductive elements formed therein, the conductive elements of the first redistribution layer coupling the plurality of pixels to the first plurality of conductive pads, and wherein the circuit chip further comprises a second redistribution layer between the second substrate and the second plurality of conductive pads, the second redistribution layer comprising a plurality of dielectric layers with conductive elements formed therein, the conductive elements of the second redistribution layer coupling the plurality of active devices to the second plurality of conductive pads.

15. The device of claim 14 further comprising a first bond pad over a portion of the second redistribution layer, the first bond pad coupled to a first via extending through a portion of the second redistribution layer and coupled to at least one of the conductive elements of the second redistribution layer, the first bond pad configured to receive and conduct a direct current (DC) signal to the circuit chip.

16. The device of claim 15 further comprising a second bond pad over a portion of the first redistribution layer, the second bond pad coupled to a second via extending through a portion of the first redistribution layer and coupled to at least one of the conductive elements of the first redistribution layer, the second bond pad configured receive and conduct DC signal to the sensor chip.

17. The device of claim 16, wherein the first bond pad and the second bond pad are at a same level.

18. A method comprising:
forming a first semiconductor chip comprising forming a first conductive pad over a first substrate;
forming a second semiconductor chip comprising forming a second conductive pad over a second substrate;
bonding a first surface of the first semiconductor chip to a second surface of the second semiconductor chip using a direct bonding method; and
forming a first capacitor with the first conductive pad and the second conductive pad being electrodes of the first capacitor.

19. The method of claim 18, wherein the first semiconductor chip is a sensor chip and wherein the forming the first semiconductor chip further comprises forming a photodiode in the first substrate, and wherein the second semiconductor chip is an application specific integrated circuit (ASIC) chip and wherein the forming the second semiconductor chip further comprises forming a logic device in the second substrate.

20. The method of claim 18, wherein the forming the first semiconductor chip further comprises forming a first dielectric layer over the first conductive pad, the first dielectric layer forming the first surface of the first semiconductor chip, wherein the forming the second semiconductor chip comprises forming a second dielectric layer over the second conductive pad, the second dielectric layer forming the second surface of the second semiconductor chip, the first and second dielectric layers forming an insulator for the first capacitor.

* * * * *